(12) United States Patent
Wang et al.

(10) Patent No.: US 12,218,683 B1
(45) Date of Patent: Feb. 4, 2025

(54) LOG LIKELIHOOD RATIOS ADJUSTMENT BASED ON ERROR TRACKER

(71) Applicant: SK hynix Inc., Gyeonggi-do (KR)

(72) Inventors: Haobo Wang, Sunnyvale, CA (US); Qiuju Diao, Santa Clara, CA (US); Fan Zhang, Fremont, CA (US)

(73) Assignee: SK hynix Inc., Gyeonggi-do (KR)

( * ) Notice: Subject to any disclaimer, the term of this patent is extended or adjusted under 35 U.S.C. 154(b) by 42 days.

(21) Appl. No.: 18/447,969

(22) Filed: Aug. 10, 2023

(51) Int. Cl.
*H03M 13/11* (2006.01)
*G06F 11/10* (2006.01)

(52) U.S. Cl.
CPC ......... *H03M 13/1125* (2013.01); *G06F 11/10* (2013.01)

(58) Field of Classification Search
CPC .............. H03M 13/1125; G06F 11/10
See application file for complete search history.

(56) References Cited

U.S. PATENT DOCUMENTS

| | | | |
|---|---|---|---|
| 8,458,563 B2 | 6/2013 | Sharon et al. | |
| 9,082,480 B2 * | 7/2015 | Alhussien | G11C 16/04 |
| 9,135,999 B2 | 9/2015 | Burger et al. | |
| 9,337,865 B2 | 5/2016 | Cohen et al. | |
| 9,378,835 B2 | 6/2016 | Burger, Jr. et al. | |
| 9,563,502 B1 * | 2/2017 | Alhussien | G11C 11/5642 |
| 9,564,921 B1 | 2/2017 | Graumann et al. | |
| 9,632,863 B2 | 4/2017 | Galbraith et al. | |
| 10,276,247 B2 | 4/2019 | Alhussien et al. | |
| 10,490,288 B1 | 11/2019 | Wang et al. | |
| 10,783,972 B2 | 9/2020 | Cai et al. | |
| 2013/0176778 A1 * | 7/2013 | Chen | G11C 16/06 365/185.03 |
| 2013/0219108 A1 * | 8/2013 | Yang | G06F 11/1068 711/E12.008 |
| 2014/0281771 A1 | 9/2014 | Yoon et al. | |
| 2016/0011970 A1 | 1/2016 | Sakurada | |
| 2016/0266969 A1 | 9/2016 | Jeon | |
| 2016/0274969 A1 | 9/2016 | Chen et al. | |
| 2016/0276036 A1 | 9/2016 | Zhang et al. | |
| 2019/0340062 A1 | 11/2019 | Cai et al. | |

(Continued)

OTHER PUBLICATIONS

D. Suneja, N. Chaturvedi and S. Gurunarayanan, "A comparative analysis of read/write assist techniques on performance & margin in 6T SRAM cell design," 2017 International Conference on Computer, Communications and Electronics (Comptelix), Jaipur, India, 2017, pp. 659-664 (Year: 2017).*

*Primary Examiner* — Cynthia Britt
(74) *Attorney, Agent, or Firm* — Weaver Austin Villeneuve & Sampson LLP

(57) ABSTRACT

Techniques for adjusting log likelihood ratios in a decoder may include determining an assist read (AR) zone based on performing assist reads (AR) of multibit memory cells of a memory. Soft reads of the multibit memory cells may be performed to determine a bin within the AR zone for each bit of the data stored in the memory cells. Each bin is associated with a log likelihood ratio (LLR) value. Error correction decoding on the data stored in the memory cells may be performed followed by collecting statistics on the decoded data for each bin in each AR zone. A hard error percentage may be computed for each AR zone based on the collected statistics, and one or more LLR values may be adjusted based on the hard error percentage.

20 Claims, 9 Drawing Sheets

(56) References Cited

U.S. PATENT DOCUMENTS

| | | | | |
|---|---|---|---|---|
| 2020/0366415 | A1* | 11/2020 | Khoshnevisan | H04W 16/14 |
| 2022/0012124 | A1* | 1/2022 | Zhang | G11C 11/5642 |
| 2023/0096401 | A1* | 3/2023 | Kiyooka | G11C 29/52 |
| | | | | 714/758 |
| 2024/0338275 | A1* | 10/2024 | Navon | G06F 11/1048 |

* cited by examiner

LOG LIKELIHOOD RATIOS ADJUSTMENT BASED ON ERROR TRACKER

BACKGROUND

Data bits contained in a data stream can get corrupted due to a variety of reasons. For example, some data bits can get corrupted during transmission of the data stream through a transmission medium (such as, for example, a wireless communication link) or when being written into, or read from, a memory device (such as, for example, a hard disk drive or a solid-state drive). Error correcting procedures, which are generally directed at identifying erroneous data bits and correcting the errors, typically involve a trade-off between accuracy, efficiency, and latency. It is desirable to provide solutions that optimize this trade-off.

BRIEF SUMMARY

Techniques for adjusting log likelihood ratios used by a decoder may include determining an assist read (AR) zone based on performing assist reads (AR) of multibit memory cells of a memory. Soft reads of the multibit memory cells may be performed to determine a bin within the AR zone for each bit of the data stored in the memory cells. Each bin is associated with a log likelihood ratio (LLR) value. Error correction decoding on the data stored in the memory cells may be performed, and statistics on the decoded data can be collected for each bin in each AR zone. A hard error percentage may be computed for each AR zone based on the collected statistics and one or more LLR values may be adjusted based on the hard error percentage.

In some implementations, a set of soft reads may be performed in a region of an AR zone where two adjacent threshold voltage distributions represent opposing logic bit values (e.g., where the bit value transitions from a logic 0 to a logic 1, or vice versa). Based on the set of soft reads, a bin corresponding to the threshold voltage level can be determined. Each bin is associated with a log likelihood ratio (LLR) value indicating the likelihood that the bit stored in the memory cell is a logic 0 or a logic 1. Statistics associated with erroneous reads for each bin in each AR zone may be collected, and one or more of the LLR values may be adjusted based on the collected statistics.

In some implementations, a memory controller can include a non-transitory computer readable medium and a processor. The processor can execute computer-executable instructions stored in the non-transitory computer readable medium for performing actions that can include determining an assist read (AR) zone based on performing assist reads (AR) of multibit memory cells of a memory. Soft reads of the multibit memory cells may be performed to determine a bin within the AR zone for each bit of the data stored in the memory cells. Each bin is associated with a log likelihood ratio (LLR) value. Error correction decoding on the data stored in the memory cells may be performed, and statistics on the decoded data can be collected for each bin in each AR zone. A hard error percentage may be computed for each AR zone based on the collected statistics and one or more LLR values may be adjusted based on the hard error percentage.

BRIEF DESCRIPTION OF THE DRAWINGS

The detailed description below makes reference to a few example embodiments that are illustrated in the accompanying drawings. However, it should be understood that the description is equally relevant to various other variations of the embodiments described herein. Such embodiments may utilize objects and/or components other than those illustrated in the drawings. It should also be understood that like reference numerals used in the various figures indicate similar or identical objects.

DETAILED DESCRIPTION

Various types of error correcting codes can be used for detecting and correcting errors that may be introduced into data that is being transmitted through a noisy medium (a noisy wireless communication link, for example) and/or is being stored into a memory device (such as, for example, a hard disk drive or a solid-state drive). One example of an error correcting code is referred to as a low-density parity-check code (LDPC). An LDPC decoder can be configured to perform error detection and correction by using log likelihood ratio (LLR) values. Each LLR value provides a statistical indication of a level of certainty or confidence that a detection of a data bit is either a logic 1 or a logic 0.

In the description provided herein, for the purposes of explanation, specific details are set forth in order to provide a thorough understanding of certain inventive embodiments. However, it will be apparent that various embodiments may be practiced without these specific details. Hence, the figures and description are not intended to be restrictive. Certain words and phrases are used herein based on convenience and such words and phrases should be interpreted in various forms and equivalencies by persons of ordinary skill in the art. For example, the word "bit" as used herein represents a binary value (either a "1" or a "0") that can be stored in a memory. Furthermore, it should be understood that each of words such as "implementation," "scenario," "approach," "application," "case" and "configuration" as used herein is an abbreviated version of the phrase "In an example ("implementation," "scenario," "approach," "application," "case," "configuration" etc.) in accordance with disclosure." It must also be understood that the word "example" as used herein is intended to be non-exclusionary and non-limiting in nature.

Figure 1:
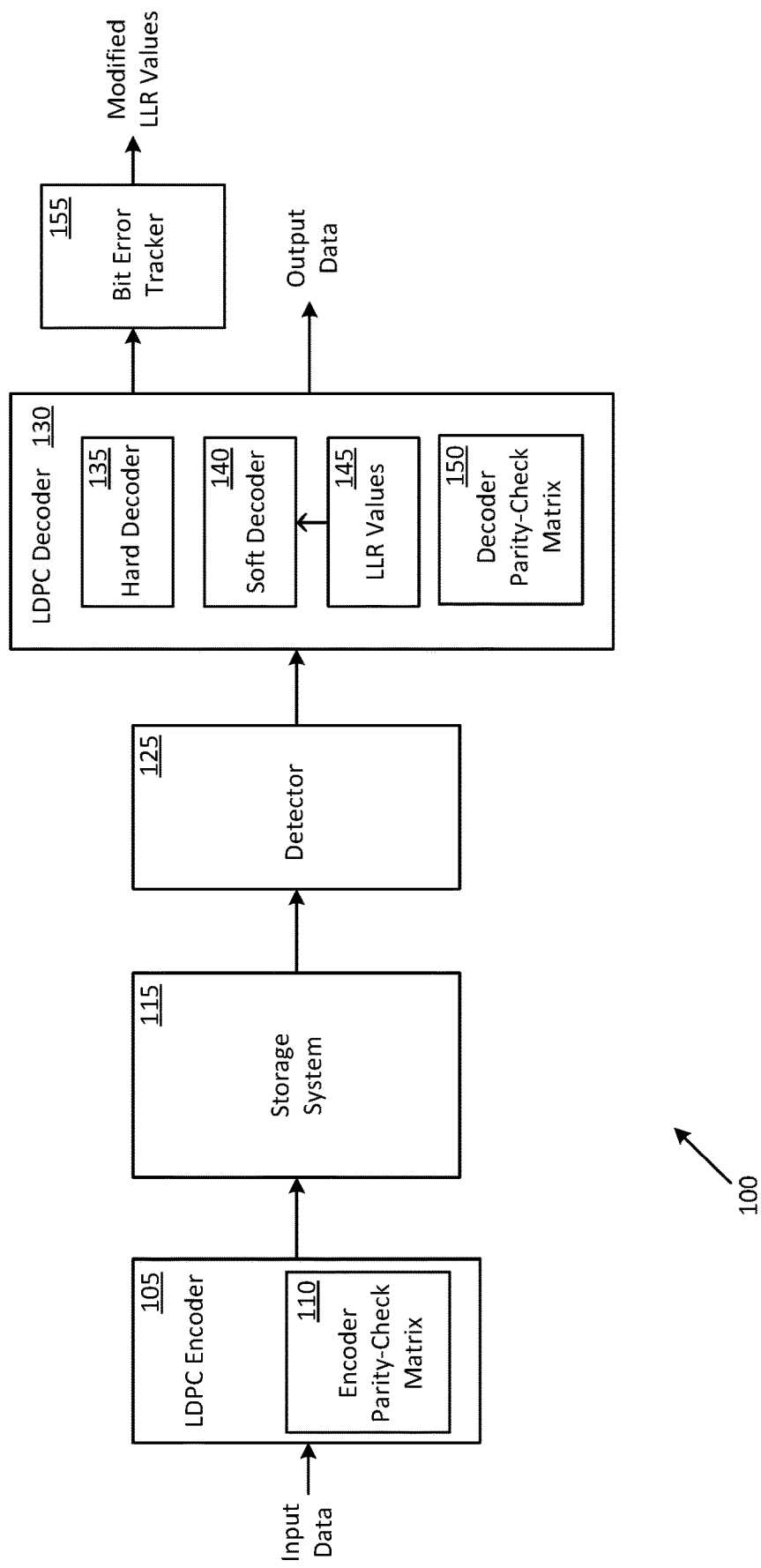
FIG. 1 illustrates a block diagram of an example error correction system that performs log likelihood ratio adjustment in accordance with an example embodiment of the disclosure.

FIG. 1 illustrates a block diagram of an example error correction system 100 that includes a bit error tracker 155 in accordance with an embodiment of the disclosure. The example error correction system 100 includes an LDPC encoder 105 that encodes input data in an encoded format (e.g., by adding parity bits) that is suitable for storing in a storage system 115. Encoding the input data enables the use of error correction procedures for correcting bit errors that may occur during operations such as, for example, writing the data into the storage system 115, or reading the stored data from the storage system 115. Storage system 115 can be, for example, solid-state drives (SSDs), storage cards, and Universal Standard Bus (USB) drives, and can be implemented using non-volatile memory such as flash memory (e.g., NAND flash).

In an example implementation, the data and parity bits produced by the LDPC encoder 105 can be stored in memory cells of a multi-level flash memory that can be a part of the storage system 115. The contents of any individual cell can be read out by applying a gate voltage having various voltage amplitudes that enable the contents of the cell to be read out. An array of multi-level flash memories can be configured to include multiple memory blocks. Each memory block may include multiple pages. For example, a set of memory cells having a word line that is coupled in common to each of the set of memory cells can be configured as a page that can be read and written (or programmed) concurrently.

More specifically, a multi-level flash memory can be a type of NAND flash memory containing an array of cells each of which can be used to store multiple bits of data. For example, a tri-level cell (TLC) flash memory can store three bits of data per cell. Each of the three bits of data can be either in a programmed state (logic 0) or in an erased stated (logic 1), thereby allowing for storage of any of eight possible logic bit combinations in each cell. Each cell can be configured to store three bits of data by placing one of eight charge levels in a charge trap layer of a cell. Thus, for example, a cell may be configured to store a 000 logic bit combination by placing a first amount of charge in the cell, a cell may be configured to store a 110 logic bit combination by placing a second amount of charge in the cell, and so on. More generally, a N-bit multi-level cell can have 2 N states or charge levels representing the different possible combinations of N bits.

Data bit errors may be introduced during storage of the data bits in the multi-level flash memory and/or when writing/reading the data bits in/out of the multi-level flash memory. The data bit errors may be introduced because of various factors such as, for example, hardware defects in the flash memory, aging of the flash memory, interference by adjacent pages, software bugs, and/or read/write timing issues, etc.

The detector 125 is configured to read the data bits stored in the storage system 115. In an example implementation, the detector 125 includes a hard output detector and a soft output detector. The hard output detector carries out detection based on voltage thresholds that provide an indication whether a detected bit is either a one or a zero. The input data bits provided to detector 125 from the storage system 115 can have bit errors. Consequently, the output produced by the hard detector can contain hard errors where one or more bits have been detected inaccurately (a "1" read as a "0" or vice-versa). The soft detector operates upon the input data and produces an output that is based on statistical probabilities indicating a confidence level whether a detected bit is a one or a zero. The statistical probabilities may be characterized, for example, based on log likelihood ratio (LLR) values.

The output of the detector 125 is coupled into the LDPC decoder 130. In an example implementation, the LDPC decoder 130 uses a decoder parity-check matrix 150 during decoding of the data bits. The decoder parity-check matrix 150 corresponds to the encoder parity-check matrix 110, and vice-versa.

In the illustrated example, the hard detector bits provided by the detector 125 may be decoded by a hard decoder 135. The soft detector bits and the statistical probability information provided by the detector 125 may be decoded by the soft decoder 140 by use of LLR values 145. In an example implementation, the LLR values 145 may be stored in the form of a table.

Hard errors can adversely affect the overall performance of the error correction system 100. It is desirable to detect and correct these hard error bits. Data errors may be quantified in various ways such as, for example, in the form of a bit error rate (BER). The overall performance of the error correction system 100 can be characterized by metrics such as, for example, a maximum bit error rate (MBER), a maximum acceptable bit error rate, and/or a residual bit error rate (RBER).

The maximum acceptable BER may be used, for example, to calculate an acceptable signal-to-noise ratio (SNR) of the error correction system 100. The residual bit error rate (RBER) provides an indication of a likelihood that a particular bit is erroneous and the error is undetected. In general, the performance of the LDPC decoder 130 not only depends upon the RBER but also upon the number of hard errors. The number of hard errors, which may be characterized in the form of a hard error percentage, degrades the error correcting capabilities of the LDPC decoder 130. More particularly, the performance of the soft decoder 140 is dependent in large part upon the LLR values 145 that are used to decode the signals provided to the LDPC decoder 130 by the detector 125. Thus, in accordance with disclosure, a bit error tracker 155 is used to evaluate the performance of the soft decoder 140 and adjust the LLR values 145 to optimize the performance of the soft decoder 140. Further details pertaining to the bit error tracker 155 is provided below.

Figure 2:
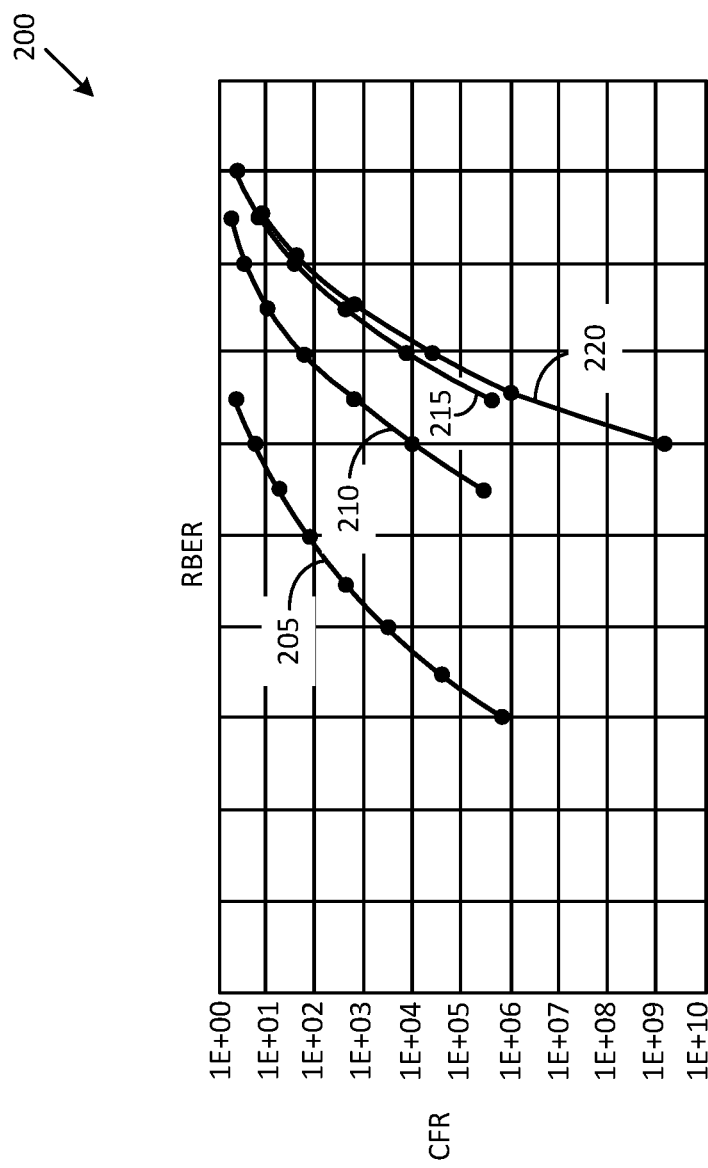
FIG. 2 illustrates a graph showing a relationship between data correction degradation in the presence of various levels of hard errors.

FIG. 2 illustrates an example graph 200 showing degradation of the error correction capability of a soft decoder (such as, for example, the soft decoder 140) in the presence of various levels of hard errors. More particularly, graph line 220 indicates RBER values when no hard errors are present. Graph line 215 indicates RBER in the presence of 10% hard errors. Graph line 210 indicates RBER in the presence of 20% hard errors. Graph line 205 indicates RBER in the presence of 40% hard errors. The bit error tracker 155 determines adjustment of LLR values 145 in accordance with the disclosure, based at least in part, on the percentage of hard errors present in data provided to the bit error tracker 155 by the hard decoder 135. This aspect is described below in more detail.

Figure 3:
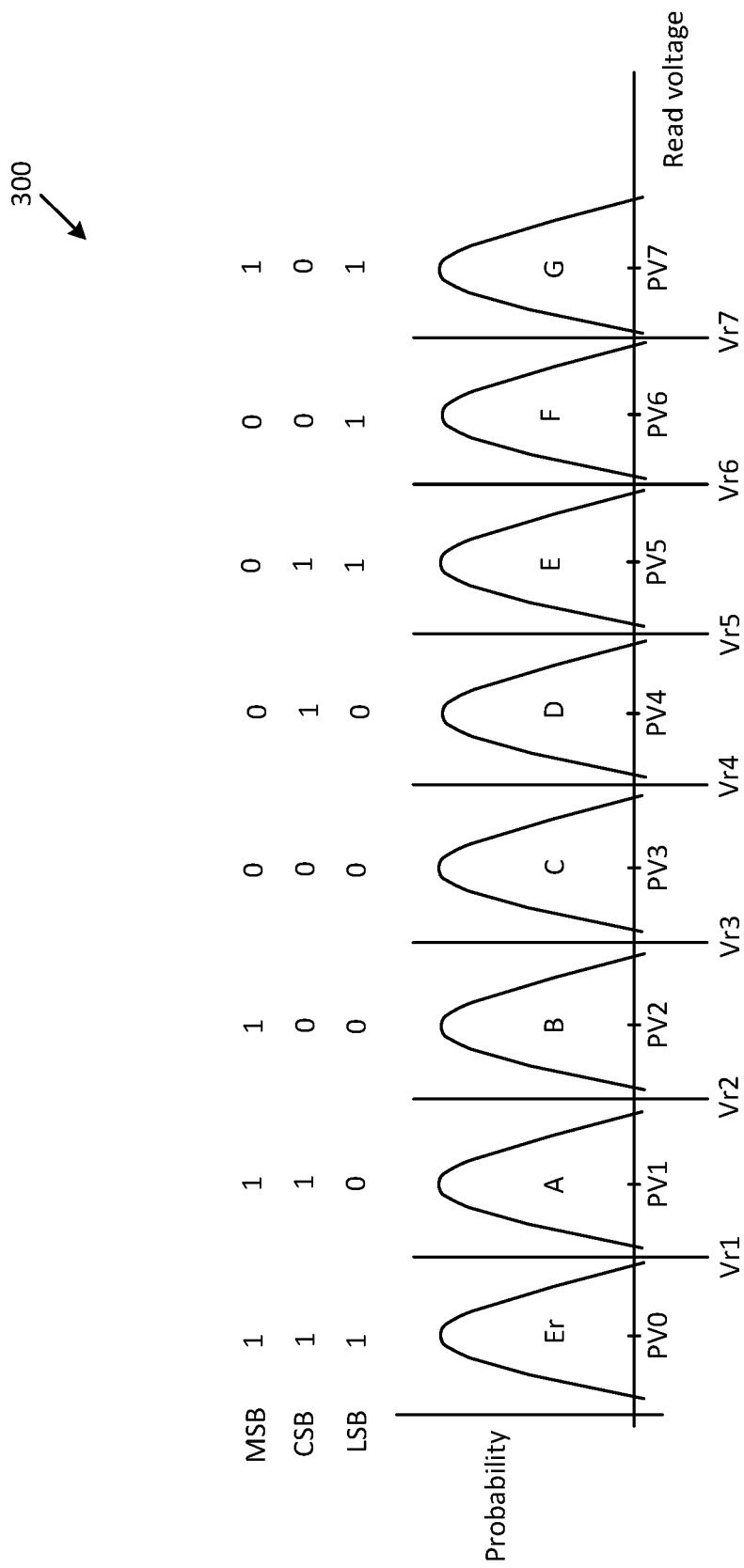
FIG. 3 illustrates an example distribution diagram of cell voltages in a tri-level cell (TLC) memory device that can be included in a storage system in accordance with the disclosure.

FIG. 3 illustrates an example distribution diagram 300 of cell voltages in a TLC flash memory that may be a part of the storage system 115. It should be understood that various aspects of the disclosure that are described herein with respect to tri-level cell operations and TLC flash memories are equally applicable to various other types of multi-level cell operations and devices such as, for example, quad-level cell (QLC) memories, penta-level cell (PLC) memories, etc. The example embodiments described herein should therefore be interpreted accordingly for other multi-level operations, flash memories, devices, and applications.

Each cell of the TLC flash memory stores three data bits, thereby allowing storage of any of eight logic combinations. The three data bits in each cell are labeled as most significant bit (MSB), center significant bit (CSB), and least significant bit (LSB). The label PV indicates a programmed state in each cell. PV0 corresponds to an erased state and each of the PV1 through PV7 programmed states corresponds to one of eight logic combinations. The erased state corresponds to 111 due to the NAND configuration of the TLC flash memory. In this example, the seven programmed states of the TLC flash memory are labeled A, B, C, D, E, F, and G. The seven programmed states can be read by applying a voltage corresponding to the seven read threshold voltages (Vr1 through Vr7). Each of the seven read threshold voltages corresponds to a valley between any two adjacent logic transitions. The probability distribution of read voltages for each individual cell is represented as a bell-shaped curve. The seven bell-shaped curves corresponding to the seven programmed states are labeled A, B, C, D, E, F, and G.

In this example, the MSB includes two logic state transitions as the threshold voltage is increased—a first logic state transition (1 to 0 transition) from state B to state C, and a second logic state transition (0 to 1 transition) from state F to state G. The CSB includes three logic state transitions—a first logic state transition (1 to 0 transition) from state A to state B, a second logic state transition (0 to 1 transition) from state C to state D, and a third logic state transition (1 to 0 transition) from state E to state F. The LSB includes two logic state transitions—a first logic state transition (1 to 0 transition) from state Er to state A, and a second logic state transition (0 to 1 transition) from state D to state E.

Figure 4:
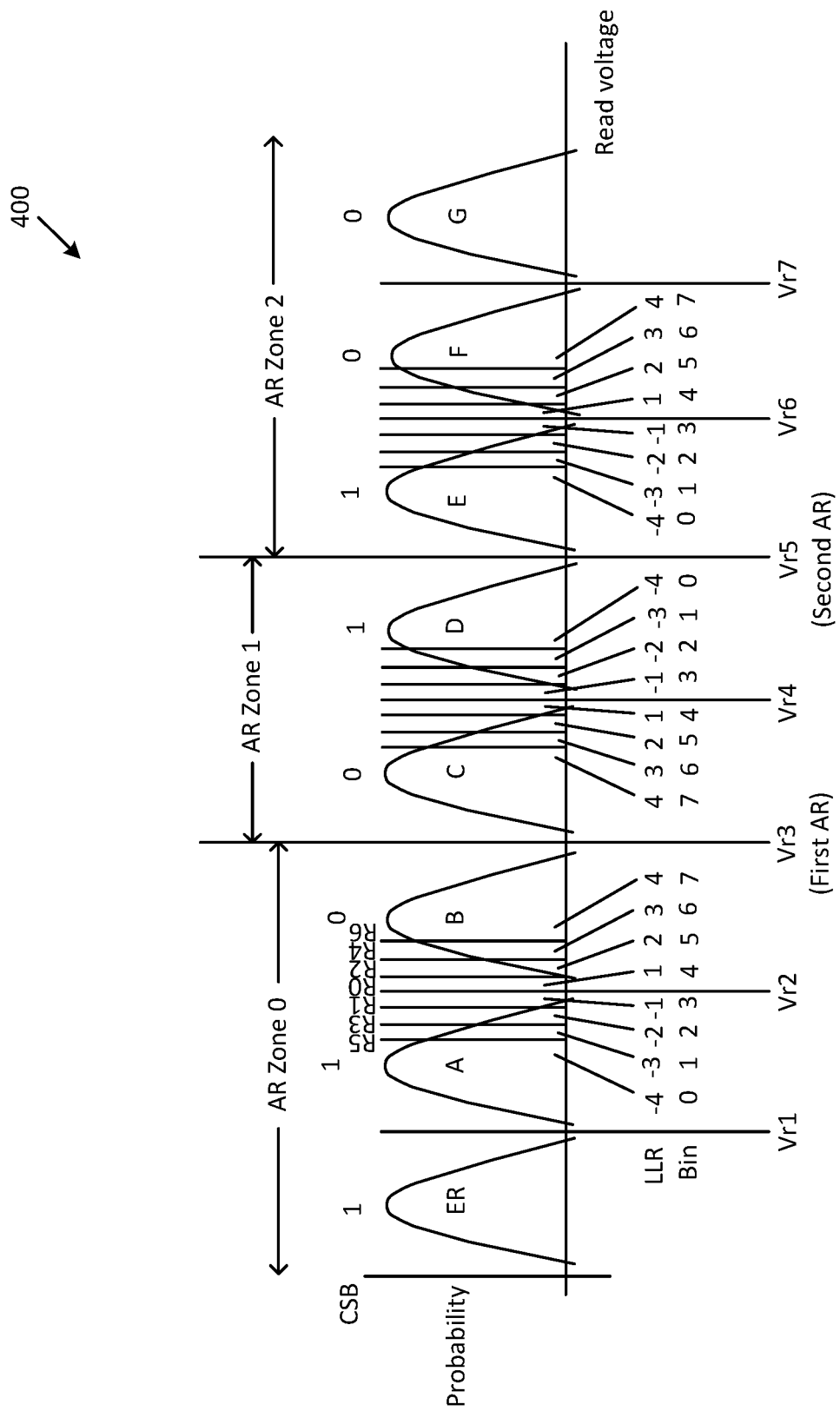
FIG. 4 illustrates some features of an example distribution diagram of cell voltages applicable to a soft decoding procedure in accordance with the disclosure.

FIG. 4 illustrates some features of an example probability distribution diagram 400 of cell voltages applicable to a soft decoding procedure in accordance with the disclosure. The example probability distribution diagram 400 illustrates the logic states of the CSB shown in FIG. 3 (11001100) when the threshold voltage is varied. In this scenario, the CSB is read as a 0 when the threshold voltage of the cell is above the read threshold voltage Vr2 and below the read threshold voltage Vr4, and is further read as a 0 when the threshold voltage of the cell is above the read threshold voltage Vr6. The CSB is read as a 1 when the threshold voltage of the cell is below the read threshold voltage Vr2, and when the threshold voltage of the cell is between the read threshold voltage Vr4 and the read threshold voltage Vr6.

As described above, the CSB includes three logic state transitions—a first logic state transition (1 to 0 transition) from state A to state B, a second logic state transition (0 to 1 transition) from state C to state D, and a third logic state transition (1 to 0 transition) from state E to state F.

Read threshold voltage Vr2 corresponds to the first logic state transition from a 1 state to a 0 state. An idealized read operation would have a step function response at the read threshold voltage Vr2. In practice, there exists an area of uncertainty on either side of the threshold voltage Vr2. The level of uncertainty can be quantified by use of a first bell-shaped curve that represents logic state A, a second bell-shaped curve that represents logic state B, and a set of LLR values that are located on either side of the read threshold voltage (Vr2) corresponding to the valley between the first bell-shaped curve and the second bell-shaped curve.

Read threshold voltage Vr4 corresponds to the second logic state transition from a 0 state to a 1 state. In this case, the level of uncertainty can be quantified by use of a third bell-shaped curve that represents logic state C, a fourth bell-shaped curve that represents logic state D, and a set of LLR values that are located on either side of the read threshold voltage Vr4 corresponding to the valley between the third bell-shaped curve and the fourth bell-shaped curve.

Read threshold voltage Vr6 corresponds to the third logic state transition from a 1 state to a 0 state. In this case, the level of uncertainty can be quantified by use of a fifth bell-shaped curve that represents logic state E, a sixth bell-shaped curve that represents logic state F, and a set of LLR values that are located on either side of the read threshold voltage Vr6 corresponding to the valley between the fifth bell-shaped curve and the sixth bell-shaped curve.

In an example implementation in accordance with the disclosure, the read threshold voltage Vr3 is designated as a first assist read voltage and the read threshold voltage Vr5 is designated as a second assist read voltage, thereby designating three assist read (AR) zones that are referred to herein as AR zone 0, AR zone 1, and AR zone 2. Each AR zone encompasses a region of the threshold voltage containing a logic transition. For example, AR zone 0 encompasses adjacent threshold voltage distributions indicated by the bell-shaped curves A and B representing the first logic transition from 1 to 0, AR zone 1 encompasses adjacent threshold voltage distributions indicated by the bell-shaped curves C and D representing the second logic transition from 0 to 1, and AR zone 2 encompasses adjacent threshold voltage distributions indicated by the bell-shaped curves E and F representing the third logic transition from 1 to 0. The description below with respect to AR zone 0 is equally applicable to AR zone 1 and AR zone 2 and should be understood as such.

The read threshold voltage Vr2 in AR zone 0 can be used for executing hard decisions (determining whether the CSB in a cell is either a 0 or a 1). In some scenarios, when data received by a decoder contains errors, hard decisions carried out by use of the read threshold voltage Vr2 can lead to errors (a 1 written into memory that is erroneously read as a 0, or vice-versa). In such scenarios, it is desirable to use a soft decision operation that utilizes multiple reads to read a programmed state of a cell. In the illustrated example, seven read operations (R0 through R6) in AR zone 0 corresponding to various read threshold voltages for reading the contents of the cell can be used. The read operation R0 can be referred to as a hard read operation and the remaining six read operations can be referred to as soft read operations. The seven read operations define eight regions in the transition or overlapping area of the bell-shaped curve 1 and the bell-shaped curve 0. Each of these eight regions may be referred to by a bin label.

Bin 0 corresponds to a first defined region below R5 and can be assigned an LLR value of −4. Bin 1 corresponds to a second defined region between R5 and R3 and can be assigned an LLR value of −3. Bin 2 corresponds to a third defined region between R3 and R1 and can be assigned an LLR value of −2. Bin 3 corresponds to a fourth defined region between R1 and R0 (at the read threshold voltage Vr2) and can be assigned an LLR value of −1. Bin 4 corresponds to a fifth defined region between R0 (at the read threshold voltage Vr2) and R2 and can be assigned an LLR value of +1. Bin 5 corresponds to a sixth defined region between R2 and R4 and can be assigned an LLR value of +2. Bin 6 corresponds to a seventh defined region between R4 and R6 and can be assigned an LLR value of +3. Bin 7 corresponds to an eighth defined region above R6 and can be assigned an LLR value of +4.

A negative LLR value indicates the read bit is likely a logic 1, and a positive LLR value indicates the read bit is likely a logic 0. The absolute magnitude of the LLR value indicates the likelihood that a read bit is a logic 1 or a logic 0. The higher the absolute magnitude, the higher the likelihood that a read bit is a logic 1 or a logic 0. Thus, in the case of the TLC flash memory, an LLR value of +4 provides an indication that the likelihood of a read bit being a logic 0 is higher than for an LLR value of +3, for example. Correspondingly, a read bit that is in bin 0 has a higher likelihood of being a logic 0 than a read bit that is located in bin 1. Similarly, an LLR value of −4 provides an indication that the likelihood of a read bit being a logic 1 is higher than when the read bit corresponds to an LLR value of −3, for example. Here, a read bit that is in bin 7 has a higher likelihood of being a logic 1 than a read bit that is in bin 6. Read bits located in bins 3 and 4 (LLR values −1 and +1) have the lowest likelihood, and the level of uncertainty whether the bit is a logic 1 or a logic 0 is highest in this area.

In some cases, each of the LLR values can be theoretically determined based on the following equations, and used in the form of preset LLR values, where Pr(r=x|w=0) is the probability of writing a logic 0 to the cell and reading a threshold voltage falling in bin x, and Pr(r=x|w=1) is the probability of writing a logic 1 to the cell and reading a threshold voltage falling in bin x.

$$LLR \text{ (bin0)} = \log \frac{Pr(r = 0|w = 0)}{Pr(r = 0|w = 1)}$$

$$LLR \text{ (bin1)} = \log \frac{Pr(r = 1|w = 0)}{Pr(r = 1|w = 1)}$$

$$\ldots$$

$$LLR \text{ (bin7)} = \log \frac{Pr(r = 7|w = 0)}{Pr(r = 7|w = 1)}$$

However, using preset LLR values may lead to an inflexible operating structure for a decoder. The inflexible operating structure may fail to take into consideration various factors causing erroneous reads in a flash memory. An example factor that may lead to a read error may be attributed to changes over time (e.g., aging) in cell characteristics in the flash memory. Another example factor that may lead to a read error may be attributed to shifts in the threshold voltages as a result of various changes in operating conditions, interference from other cells, and/or in circuitry, associated with the flash memory.

Accordingly, it is desirable to provide for a solution in accordance with the disclosure that allows for flexible reconfiguration of a soft decoder (such as, for example, the soft decoder 140 shown in FIG. 1). The flexible reconfiguration can include modifying one or more of the LLR values such as, for example, one or more of the LLR values 145 that can be stored in a table in the LDPC decoder 130.

Figure 5:
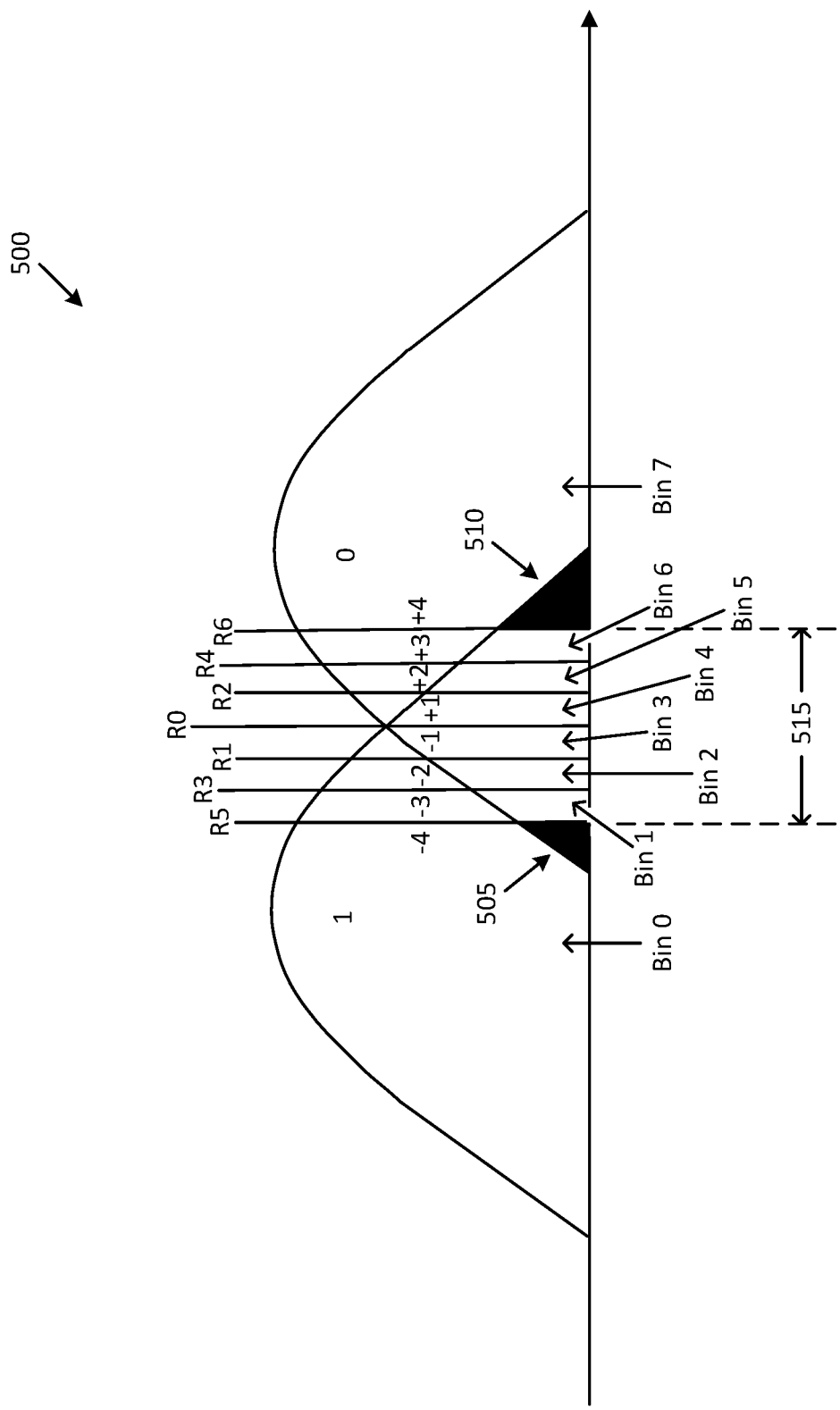
FIG. 5 illustrates some features of another example distribution diagram of cell voltages applicable to a soft decoding procedure in accordance with the disclosure.

FIG. 5 illustrates an enlarged view of some features of an example probability distribution diagram 500 of cell voltages applicable to a soft decoding procedure in accordance with the disclosure. The example probability distribution diagram 500 illustrates adjacent logic states corresponding to a 1 and a 0. The seven read operations described above (hard read operation R0 and soft read operations R1 through R6) are illustrated along with the respective bins. A hard error can be defined as an event that may occur during a soft read as a result of a cell voltage falling outside a soft read range 515 that is centered around an optimal read threshold. In the case of a flash memory having a single level cell (SLC) structure, an example soft read range can span ±400 mV around R0. An example soft read range for an MLC cell can span ±400 mV around R0. An example soft read range for a TLC cell can span ±250 mV around R0.

The example probability distribution diagram 500 illustrates a first region 505 and a second region 510, each having an overlap between the two bell-shaped curves of the two logic states. In an example scenario, a hard error can occur in the first region 505 and/or in the second region 510. For example, a cell threshold voltage falling in bin 0 with a LLR value of −4 should have a high likelihood of being a logic 1. However, a hard error may occur in region 505 if the read data is decoded to be a logic 0 instead of a logic 1. Similarly, a cell threshold voltage falling in bin 7 with a LLR value of +4 should have a high likelihood of being a logic 0. However, a hard error may occur in region 510 if the read data is decoded to be a logic 1 instead of a logic 0.

Figure 6:
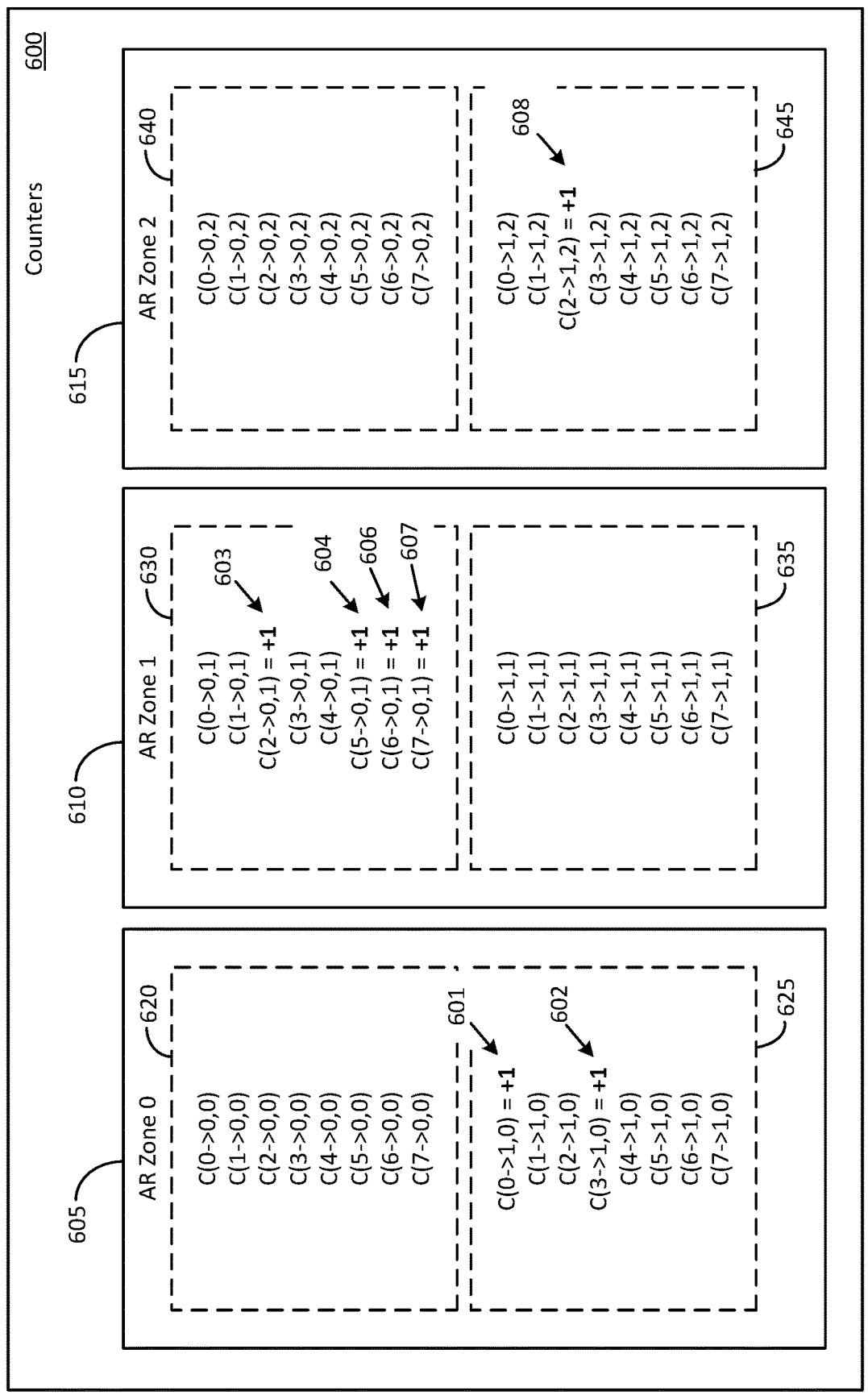
FIG. 6 illustrates an example implementation of counters that can be a part of a bit error tracker in accordance with the disclosure.

FIG. 6 illustrates an example implementation of counters 600 that can be a part of the bit error tracker 155 in accordance with the disclosure. In an example operation, the LDPC decoder 130 performs read operations on the multibit memory cells of a TLC flash memory in the manner described above. The read operations include assist read operations to determine an AR zone for each bit of data stored in the TLC flash memory. The read operations can further include soft reads to determine a bin within each AR zone for each bit of data.

Errors may be present at the input of the LDPC decoder 130 for various reasons including due to changes in the characteristics of the flash over time, interference from neighboring cells, etc. The bit error tracker may be configured in accordance with the disclosure, to track and identify such errors, identify the LLRs associated with the errors, collect statistics based on the identified LLRs, and adjust one or more LLR values based on evaluating the statistics. Evaluating the statistics can include, for example, computing a hard error percentage for each AR zone and adjusting the LLR values based on the hard error percentage. In an example embodiment, the bit error tracker performs such operations by using a set of counters for each AR zone.

FIG. 6 illustrates the counters arranged in three groups corresponding to the three AR zones—AR zone 0, AR zone 1, and AR zone 2 (described above and illustrated in FIG. 4). A first set of counters in each group is configured to monitor bit values decoded to a logic 0 from each bin ranging from bin 0 to bin 7, and a second set of counters is configured to monitor bit values decoded to a logic 1 from each bin (ranging from bin 0 to bin 7). More particularly, a first group 605 corresponding to AR zone 0 has a first set of counters 620 and a second set of counters 625. A second group 610 corresponding to AR zone 1 has a first set of counters 630 and a second set of counters 635. A third group 615 corresponding to AR zone 2 has a first set of counters 640 and a second set of counters 645.

Some of the description below is directed primarily to the first group 605. However, it should be understood that the description, such as, for example, structural and functional aspects of each of the set of counters, is equally applicable to the other two groups and should be understood in context.

Each set of counters includes eight counters, each of which is labeled in a C(B→Y, AR) format where "C" is an abbreviation for counter, "B" is a bin label (ranging from bin 0 to bin 7), "Y" is the decoded logic state (1 or 0) of the bit being read, and "AR" indicates the associated AR zone. The output of each counter provides a count of the number of read bits belonging to each bin B in each AR zone that have decoded to the Y logic state.

For example, the label C(0→0,0) represents a first counter that counts reads in bin 0 of AR zone 0 that decoded to a logic 0, the label C(1→0,0) represents a second counter that counts reads in bin 1 of AR zone 0 that decoded to a logic 0, the label C(2→0,0) represents a third counter that counts reads in bin 2 of AR zone 0 that decoded to a logic 0, and so on. The label C(0→1,0) represents a first counter that counts reads in bin 0 of AR zone 0 that decoded to a logic 1, the label C(1→1,0) represents a second counter that counts reads in bin 1 of AR zone 0 that decoded to a logic 1, the label C(2→1,0) represents a third counter that counts reads in bin 2 of AR zone 0 that decoded to a logic 1, and so on.

A similar format is used for each of the counters in each of AR zone 1 and AR zone 2. Thus, for example, the label C(0→0,1) represents a first counter that counts reads in bin 0 of AR zone 1 that decoded to a logic 0, the label C(1→0,1) represents a second counter that counts reads in bin 1 of AR zone 1 that decoded to a logic 1, the label C(2→0,1) represents a third counter that counts reads in bin 2 of AR zone 1 that decoded to a logic 0, and so on. The label C(0→1,1) represents a first counter that counts reads in bin 0 of AR zone 1 that decoded to a logic 1, the label C(1→1,1) represents a second counter that counts reads in bin 1 of AR zone 1 that decoded to a logic 1, the label C(2→1,1) represents a third counter that counts reads in bin 2 of AR zone 1 that decoded to a logic 1, and so on.

An example set of data bits being read can include, for example, seven CSB bits read from seven cells of a word line in the TLC flash memory. The result of the soft reads may be (0,0), (6,1), (7,1), (2,1), (5,1), (2,2), (3,0), in which the two tuple values represent the bin and AR zone (bin, AR) corresponding to each CSB bit being read. Referring back to FIG. 4, the soft read (0,0) corresponds to bin 0 of AR zone 0, and thus has a LLR value of −4 indicating the bit has a very high likelihood of being a logic 1; the soft read (6,1) corresponds to bin 6 of AR zone 1, and thus has a LLR value of +3 indicating the bit has a high likelihood of being a logic 0; the soft read (7,1) corresponds to bin 7 of AR zone 1, and thus has a LLR value of +4 indicating the bit has a very high likelihood of being a logic 0; the soft read (2,1) corresponds to bin 2 of AR zone 1, and thus has a LLR value of −2 indicating the bit has a medium likelihood of being a logic 1; the soft read (5,1) corresponds to bin 5 of AR zone 1, and thus has a LLR value of +2 indicating the bit has a medium likelihood of being a logic 0; the soft read (2,2) corresponds to bin 2 of AR zone 2, and thus has a LLR value of −2 indicating the bit has a medium likelihood of being a logic 1; and the soft read (3,0) corresponds to bin 3 of AR zone 0, and thus has a LLR value of −1 indicating the bit has a slight likelihood of being a logic 1. By way of example, the LDPC decoder 130 may perform error correction decoding on the seven read bits, which may yield the decoded bit values of (1, 0, 0, 0, 0, 1, 1) corresponding to the soft reads (0,0), (6,1), (7,1), (2,1), (5,1), (2,2), (3,0). It should be noted that in this example, soft read (2,1) decoded to a logic 0 even though the LLR indicates a medium likelihood of being a logic 1. This may indicate that a bit error may have occurred for this cell.

Consequently, counters 600 of the bit error tracker can be incremented as follows. For soft read (0,0) that decoded to a bit value of 1, the counter value of C(0→1,0) is incremented, as indicated by reference number 601. For soft read (6,1) that decoded to a bit value of 0, the counter value of C(6→0,1) is incremented, as indicated by reference number 606. For soft read (7,1) that decoded to a bit value of 0, the counter value of C(7→0,1) is incremented, as indicated by reference number 607. For soft read (2, 1) that decoded to a bit value of 0, the counter value of C(2→0,1) is incremented, as indicated by reference number 603. For soft read (5,1) that decoded to a bit value of 0, the counter value of C(5→0,1) is incremented, as indicated by reference number 604. For soft read (2,2) that decoded to a bit value of 1, the counter value of C(2→1,2) is incremented, as indicated by reference number 608. For soft read (3,0) that decoded to a bit value of 1, the counter value of C(3→1,0) is incremented, as indicated by reference number 602.

Each bit of the multi-level cell (e.g., MSB, CSB, LSB) can have its own set of counters. Furthermore, each word line or page in the memory can maintain separate counters to count decoded bit values for each bin of each AR zone. In some implementations, instead of maintaining a set of counters for each word line, adjacent word lines can be grouped together into word line groups, and one set of counters can be used for all the word lines in each word line group. The counters can be allowed to increment for a predetermined amount of time, predetermine number of program/erase cycles, and/or for a predetermined number of reads. Thereafter, count values can be evaluated to determine if the LLR values should be adjusted to reflect the characteristics of each word line or word line group. Hence, each word line or word line group can have its own LLR table. The count values can be evaluated periodically or at certain points in time (intermittently, randomly, or on an as-need basis) during the lifetime of the memory to update the LLR values.

In some implementations, the counter values can be evaluated by the bit error tracker 155. The bit error tracker 155 can be implemented, for example, using firmware and/or software executable by a processor of a memory controller. The evaluation is directed at obtaining statistical information associated with performance characteristics of the LLR values 145 used by the soft decoder 140 in the LDPC decoder 130. The evaluation may be used to identify various conditions of the word lines or word line groups of the memory. For examples, the statistics collected by the counters can determine the number of errors that have been corrected as well as hard errors that have occurred. The number of read errors of logic 1 that have been corrected to logic 0 can be determined, for example, by the count values in counters C(0→0, AR), C(1→0, AR), C(2→0, AR), and C(3→0, AR). The number of read errors of logic 0 that have been corrected to logic 1 can be determined, for example, by the count values in counters C(4→1, AR), C(5→1, AR), C(6→1, AR), and C(7→1, AR). Of these read errors, the number of hard errors can be determined, for example, by the count values in counters C(0→0, AR) and C(7→1, AR).

The errors can be indicative of conditions that can adversely affect the performance of the memory, such as, for example, resulting in a degradation of data retention, a corruption of data stored in one or more cells, a hardware failure of one or more cells, a change or shift in the threshold voltage distributions, etc. The evaluation can identify one or more LLR values that can be modified to improve the error decoding. Modification of the LLR values may be carried out by modifying the LLR values for one or more of the threshold voltage distribution bins described above. In an example implementation, that is described below in more detail, the count values can be used to remap one or more bin labels to different LLR values.

In an example process, evaluation of the counters illustrated in FIG. 6 may be carried out by executing the example steps shown below:

Hard_err_cnt=0//total hard error count
Hard_err_cnt_per_ar_0 to 1=[0, . . . 0]//hard error count per AR pattern. Hard_err_cnt_per_ar_1 to 0=[0, . . . 0]//hard error count per AR pattern
Hard_err_cnt_per_ar=[0, . . . 0]//hard error count per AR pattern
Total_err_cnt=0.
Total_err_cnt_per_ar_0 to 1=[0, . . . 0]
Total_err_cnt_per_ar_1 to 1=[0, . . . 0]
Total_err_cnt_per_ar=[0, . . . 0]
Hard_err_percent=0
Hard_err_percent_per_ar_0 to 1=[0, . . . 0]
Hard_err_percent_per_ar_1 to 0=[0, . . . 0]
Hard_err_percent_per_ar=[0, . . . 0]
For ar in AR:
    Hard_err_cnt_per_ar_0 to 1[ar]=C(7→1, ar)
    Hard_err_cnt_per_ar_1 to 0[ar]=C(0→0, ar)
    Hard_err_cnt_per_ar[ar]=Hard_err_cnt_per_ar_0 to 1[ar]+Hard_err_cnt_per_ar_1 to 0[ar]
    Hard_err_cnt=Hard_err_cnt+Hard_err_cnt_per_ar[ar]
    For bin_label in [0,1,2,3]
        Total_err_cnt_per_ar_1 to 0 [ar]=Total_err_cnt_per_ar_1 to 0[ar]+C(bin_label→0, ar)
    For bin label in [4,5,6,7]
        Total_err_cnt_per_ar_0 to 1[ar]=Total_err_cnt_per_ar_0 to 1[ar]+C(bin_label→1, ar)
    Total_err_cnt_per_ar[ar]=Total_err_cnt_per_ar_1 to 0[ar]+Total_err_cnt_per_ar_0 to 1[ar]
    Total_err_cnt=Total_err_cnt+Total_err_cnt_per_ar[ar]
For ar in AR:
    Hard_err_percent_per_ar[ar]=hard_err_cnt_per_ar[ar]/total_err_cnt_per_ar[ar]
    Hard_err_percent_per_ar_0 to 1[ar]=hard_err_cnt_per_ar_0 to 1[ar]/total_err_cnt_per_ar_0 to 1[ar]
    Hard_err_percent_per_ar_1 to 0[ar]=hard_err_cnt_per_ar_1 to 0[ar]/total_err_cnt_per_ar_1 to 0[ar]
Hard_err_percent=hard_err_cnt/total_err_cnt Based on executing the example steps shown above, a hard error percentage for each AR zone can be determined by evaluating the various counter output values of the various counters. The hard error percentage per AR zone can then be used to modify a mapping of LLR values to bin values such as, for example, modifying one or more of the LLR values 145 illustrated in FIG. 1. In an example scenario, evaluating the various counter output values of the counters in AR zone 0 involves identifying whether a hard error percentage of decoding errors where a read of logic 0 was decoded to a logic 1 exceeds a threshold value $\alpha_{0\to 1}$. The threshold value $\alpha_{0\to 1}$ may be identified in various ways such as, for example, based on a priori data analysis and/or a system performance requirement (low MBER and/or low RBER, for example), or other heuristics. If the hard error percentage exceeds the threshold value, LLR values used in future reads may be remapped in a lookup table of LLR values 145. For example, bin 7 that is currently mapped to +4 LLR value may be remapped to a lower LLR value such as, for example, +3 or +2.

In another example scenario, where the hard error percentage of decoding errors where a read of logic 1 was decoded to a logic 0 exceeds a threshold value $\alpha_{1\to 0}$, LLR values used in future reads may be remapped in a lookup table of LLR values 145. For example, bin 0 that is currently mapped to −4 LLR value may be remapped to a higher LLR value such as, for example, −3 or −2.

In another example embodiment, the LLR values 145 for future use may be determined for each AR zone by use of the example formulae shown below for AR zone 0. Similar formulae can be used for other AR zones.

$$LLR\ (\text{bin0},\ AR = 0) = \log\frac{C(0 - > 0,\ 0)}{C(0 - > 1,\ 0)}$$

$$LLR\ (\text{bin1},\ AR = 0) = \log\frac{C(1 - > 0,\ 0)}{C(1 - > 1,\ 0)}$$

$$\ldots$$

$$LLR\ (\text{bin7},\ AR = 0) = \log\frac{C(7 - > 0,\ 0)}{C(7 - > 1,\ 0)}$$

It should be noted that adjacent word lines in a TLC flash memory having a NAND architecture usually have similar characteristics and can share a LLR table. Consequently, in an example implementation, computation complexity may be reduced by performing one set of calculations for a group of word lines (e.g., adjacent word lines) instead of performing a set of calculations for each individual word line in the group. The word lines in each block of memory cells can be grouped into word line groups. Bit error statistics may then be collected on a word line basis in a format such as C(B→Y, AR, WL), where the label WL indicates a word line. In this case, the format C(B→Y, AR, WL) is a variation of the C(B→Y, AR) format described above. The collected bit errors from all counters associated with the word lines in a group may be combined C(B→Y, AR)=$\Sigma_{WL}$C(B→Y, AR, WL) and evaluated in the manner described above with reference to the counters illustrated in FIG. 6. The evaluation can be used to identify LLR values to modify, and the modified LLR values (e.g., in a LLR table) can be applied to all the word lines in the word line group.

Figure 7:
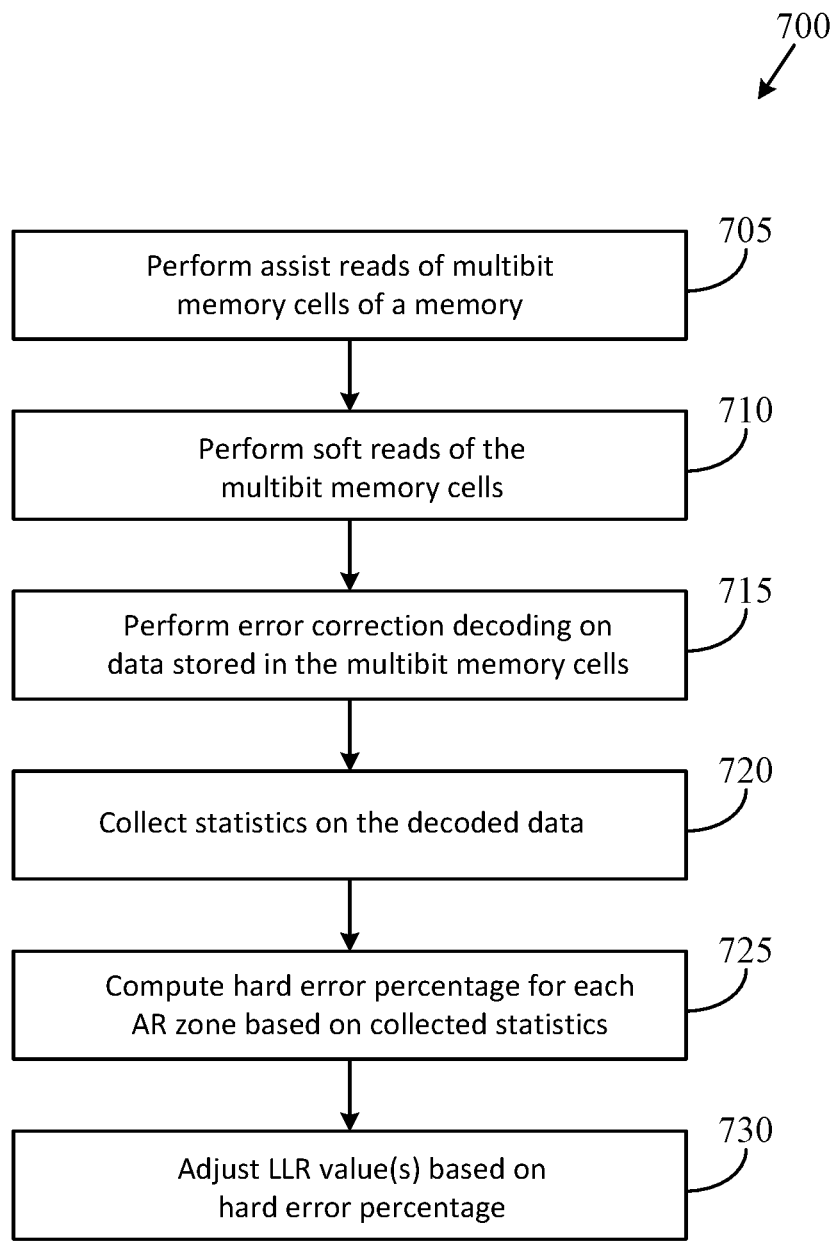
FIG. 7 illustrates a flow diagram of an example process for LLR adjustment in accordance with the disclosure.

FIG. 7 illustrates a simplified flow chart 700 of an example process for LLR adjustment in accordance with the disclosure. The process can include, at step 705, performing assist reads (AR) of multibit memory cells of a memory to determine an AR zone for each bit of data stored in the multibit memory cells. In an example embodiment, the memory can be a NAND flash memory that can be a component of a storage system, such as the storage system 115 described above. At step 710, soft reads of the multibit memory cells may be performed to determine a bin within the AR zone for each bit of the data stored in the memory cells. Each bin is associated with a log likelihood ratio (LLR) value.

At step 715, error correction decoding can be performed on the data stored in the multibit memory cells. At step 720, statistics on the decoded data for each bin in each AR zone may be collected. In an example implementation, collecting statistics can include maintaining a counter for each bin in each AR zone that decoded to a bit value of 0, and maintaining a counter for each bin in each AR zone that decoded to a bit value of 1. This aspect is described above with reference to FIG. 6.

At step 725, a hard error percentage may be computed for each AR zone based on the collected statistics. The hard error percentage can be, for example, a hard error percentage of reading a bit value of 0 that decoded to a bit value of 1 (denoted as "0 to 1"), which can be computed as the ratio of the hard error count of 0 to 1 for a particular AR zone to the total number of errors of 0 to 1 for the AR zone. The hard error count of 0 to 1 is the count value of counter C(7→1, ar), and the total number of errors of 0 to 1 is the sum of the count values of counters C(4→1, ar), counter C(5→1, ar), counter C(6→1, ar), and counter C(7→1, ar). As another example, the hard error percentage can be a hard error percentage of reading a bit value of 1 that decoded to a bit value of 0 (denoted as "1 to 0"), which can be computed as the ratio of the hard error count of 1 to 0 for a particular AR zone to the total number of errors of 1 to 0 for the AR zone. The hard error count of 1 to 0 is the count value of counter C(0→0, ar), and the total number of errors of 1 to 0 is the sum of the count values of counters C(0→0, ar), counter C(1→0, ar), counter C(2→0, ar), and counter C(3→0, ar).

At step 730, one or more LLR values for the AR zone can be adjusted based on the hard error percentage. In an example implementation, adjusting the one or more LLR values can include comparing the hard error percentage of 0 to 1 with a threshold, determining that the hard error percentage of 0 to 1 is above the threshold, and decreasing the LLR value associated with the bin having a largest likelihood of being a bit value of 0 (e.g., decrease the LLR value of bin 7 such as decrease LLR=4 to LLR=3). As another example, adjusting the one or more LLR values can include comparing the hard error percentage of 1 to 0 with a threshold, determining that the hard error percentage of 1 to 0 is above the threshold, and increasing the LLR value associated with the bin having a largest likelihood of being a bit value of 1 (e.g., increase the LLR value of bin 0 such as increase LLR=−4 to LLR=−3). The adjusted LLR values can be updated in the LLR table for the word line or word line group, and subsequent soft decoding for the word line or word line group can use the adjusted LLR values.

Figure 8:
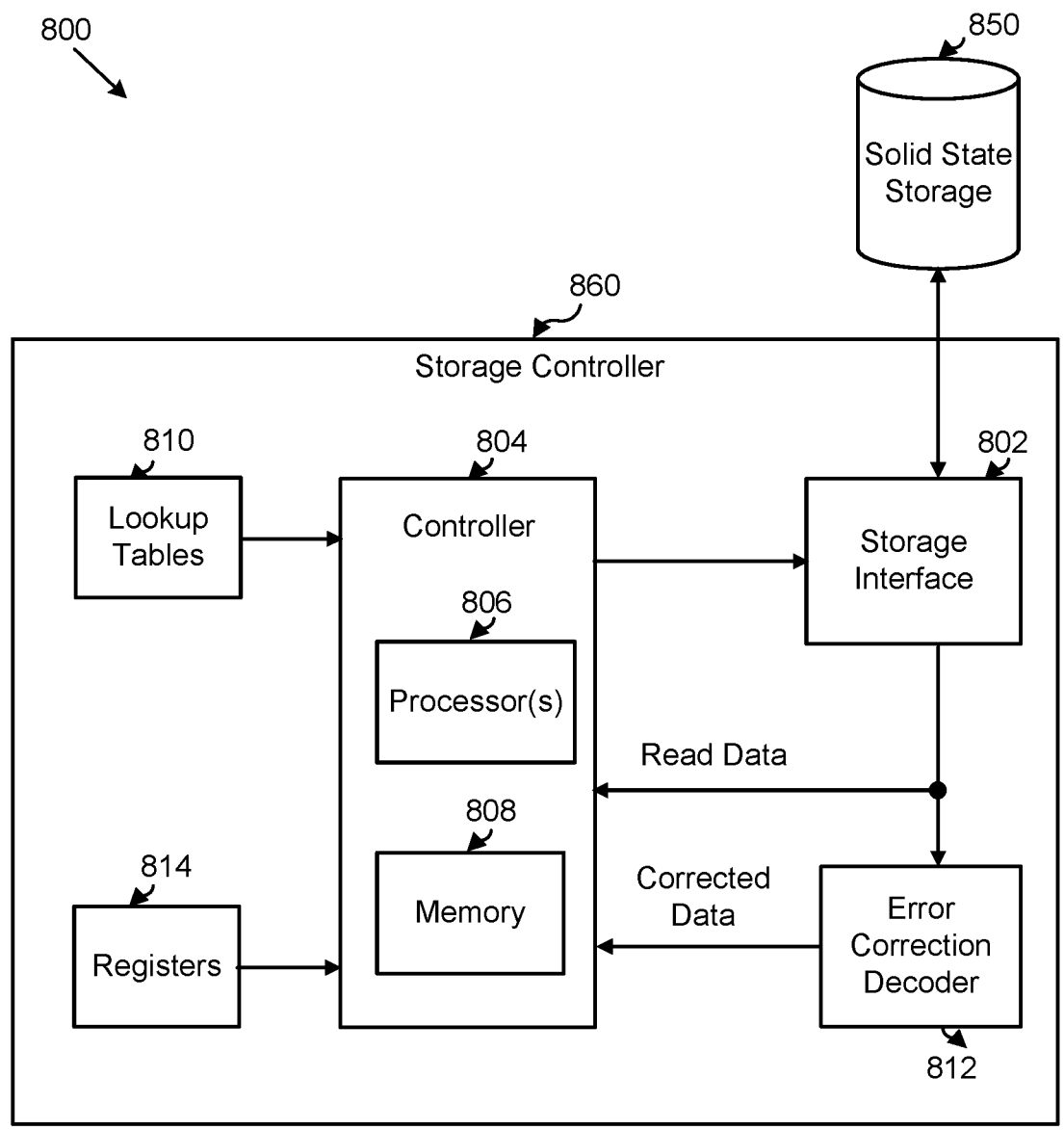
FIG. 8 illustrates a block diagram of an example of a storage device configured to perform LLR adjustment in accordance with the disclosure.

FIG. 8 shows a simplified block diagram illustrating a solid-state storage system 800, which can be an example of an electronic device utilizing the LLR adjustment techniques described herein. As shown, solid-state storage system 800 can include a solid-state storage device 850 (e.g., implemented using flash memory) and a storage controller 860. Storage controller 860, also referred to as a memory controller, is one example of a system that can perform the processes and techniques described herein. In some embodiments, storage controller 860 can be implemented on a semiconductor device, such as an application-specific integrated circuit (ASIC) or field programmable gate array (FPGA). Some of the functions can also be implemented in firmware or software. Solid-state storage system 800 is an example of a solid-state drive (SSD).

Controller 804 can include one or more processors 806 and memories 808 (non-transitory computer readable medium) for performing the control functions described herein. Storage controller 860 can also include lookup tables 810, which can include, for example, LLR tables, etc. Registers 814 can be used to store data for control functions and configurations for storage controller 860.

Controller 804 can be coupled to solid-state storage 850 through a storage interface 802. Error-correction decoder 812 (e.g., an LDPC decoder) can perform error-correction decoding on the read data and send the corrected data to controller 804. Controller 804 can update the bit error tracker counters, evaluate the count values, and update the LLR tables according to the techniques disclosed herein.

Figure 9:
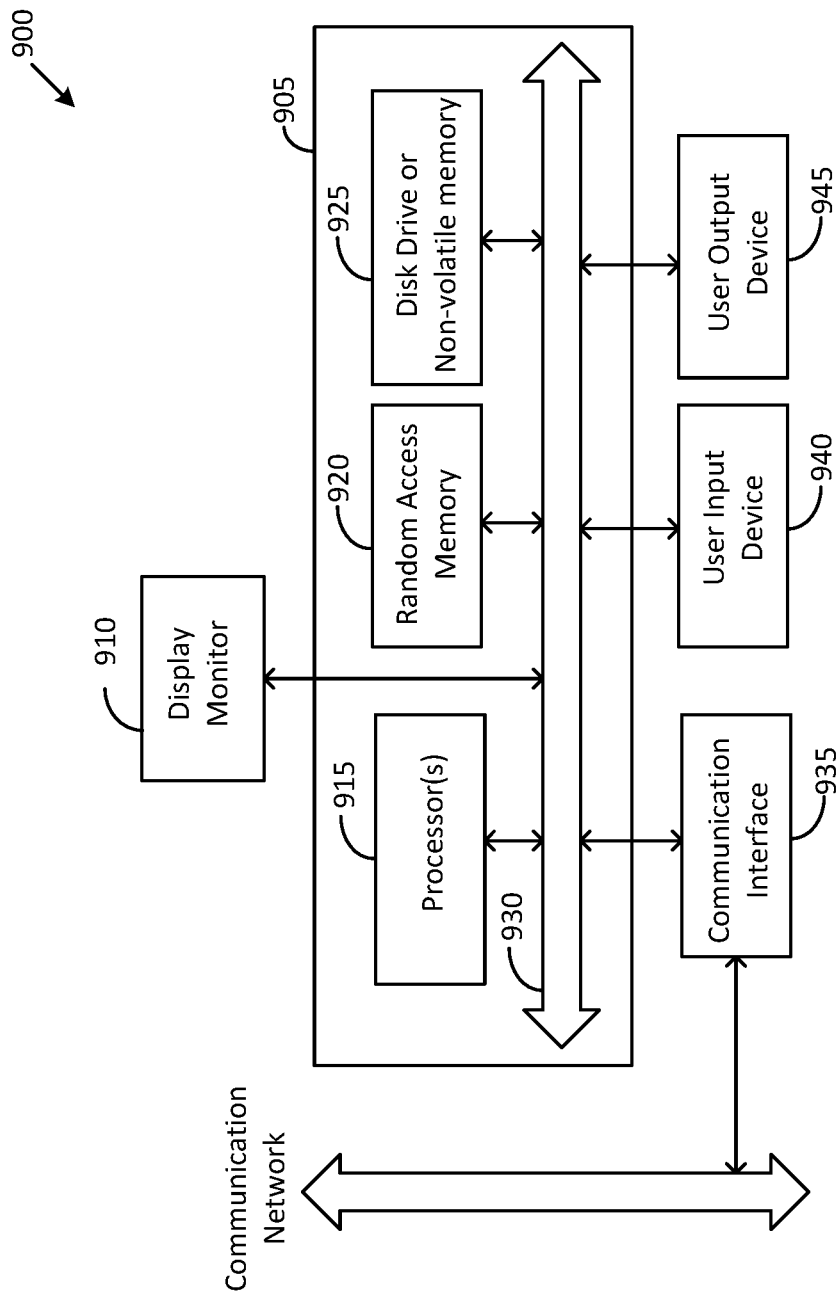
FIG. 9 illustrates an example computing device in accordance with an embodiment of the disclosure.

FIG. 9 illustrates a computer system 900 usable for implementing one or more embodiments of the present disclosure. FIG. 9 is merely an example and does not limit the scope of the disclosure as recited in the claims. As shown in FIG. 9, the computer system 900 may include a display monitor 910, a computer 905, a user output device 945, a user input device 940, a communications interface 935, and may further include other computer hardware or accessories. In an example implementation, the computer system 900, or select components of the computer system 900, can be used to implement the LLR 99 adjustment techniques disclosed herein. For example, non-volatile memory 925 may include a flash memory whose LLR values are adjusted according to the techniques disclosed herein.

The computer 905 may include one or more processors such as, for example, the processor 915 that is configured to communicate with a number of peripheral devices via a bus subsystem 930. Some example peripheral devices may include the user output device 945, the user input device 940, and the communications interface 935. The computer 905 may further include a storage subsystem that includes a random-access memory (RAM) 920 and a disk drive 925 or other forms of non-volatile memory.

The user input device 940 can be any of various types of devices and mechanisms for inputting information to the computer 905 such as, for example, a keyboard, a keypad, a touch screen incorporated into the display, and audio input devices (such as voice recognition systems, microphones, and other types of audio input devices). In various embodiments, the user input device 940 is typically embodied as a computer mouse, a trackball, a track pad, a joystick, a wireless remote, a drawing tablet, a voice command system, an eye tracking system, and the like. The user input device 940 typically allows a user to select objects, icons, text and the like that appear on the monitor 910 via a command such as a click of a button or the like.

The user output device 945 can be any of various types of devices and mechanisms for outputting information from the computer 905 such as, for example, a display (e.g., the display monitor 910), non-visual displays such as audio output devices, etc.

The communications interface 935 provides an interface to a communication network. The communications interface 935 may serve as an interface for receiving data from and transmitting data to other systems. Embodiments of the communications interface 935 typically include an Ethernet card, a modem (telephone, satellite, cable, ISDN), (asynchronous) digital subscriber line (DSL) unit, FireWire interface, USB interface, and the like. In an example implementation, the communications interface 935 may be coupled to a computer network, to a FireWire bus, or the like. In other example implementations, the communications interfaces 935 may be physically integrated on the motherboard of the computer 905, and may include a software program, such as soft DSL, or the like.

In various embodiments, the computer system 900 may also include software that enables communications over a network such as the HTTP, TCP/IP, RTP/RTSP protocols, and the like. In alternative embodiments of the present disclosure, other communications software and transfer protocols may also be used, for example IPX, UDP or the like.

The RAM 920 and the disk drive 925 are examples of non-transitory computer-readable media configured to store computer-executable instructions for performing operations associated with various embodiments of the present disclosure, including executable computer code, human readable code, or the like. Other types of computer-readable storage media include floppy disks, removable hard disks, optical storage media such as CD-ROMS, DVDs and bar codes, semiconductor memories such as flash memories, non-transitory read-only-memories (ROMS), battery-backed volatile memories, networked storage devices, and the like. The RAM 920 and the disk drive 925 may be configured to store the basic programming and data constructs that provide the functionality of the present disclosure.

Software code modules and instructions that provide the functionality of the present disclosure may be stored in the RAM 920 and the disk drive 925. These software modules may be executed by the processor 915. The RAM 920 and the disk drive 925 may also provide a repository for storing data used in accordance with the present disclosure.

The RAM 920 and the disk drive 925 may include a number of memories such as a main random-access memory (RAM) for storage of instructions and data during program execution and a read-only memory (ROM) in which fixed non-transitory instructions are stored. The RAM 920 and the disk drive 925 may include a file storage subsystem providing persistent (non-volatile) storage for program and data files. The RAM 920 and the disk drive 925 may also include removable storage systems, such as removable flash memory.

The bus subsystem 930 provides a mechanism for letting the various components and subsystems of the computer 905 communicate with each other as intended. Although the bus subsystem 930 is shown schematically as a single bus, alternative embodiments of the bus subsystem may utilize multiple busses.

It will be readily apparent to one of ordinary skill in the art that many other hardware and software configurations are suitable for use with the present disclosure. For example, the computer 905 may be a desktop, portable, rack-mounted, or tablet configuration. Additionally, the computer 905 may be a series of networked computers. In still other embodiments, the techniques described above may be implemented upon a chip or an auxiliary processing board.

Various embodiments of the present disclosure can be implemented in the form of logic in software or hardware or a combination of both. The logic may be stored in a computer-readable or machine-readable non-transitory storage medium as a set of instructions adapted to direct a processor of a computer system to perform a set of steps disclosed in embodiments of the present disclosure. The logic may form part of a computer program product adapted to direct an information-processing device to perform a set of steps disclosed in embodiments of the present disclosure. Based on the disclosure and teachings provided herein, a person of ordinary skill in the art will appreciate other ways and/or methods to implement the present disclosure.

The data structures and code described herein may be partially or fully stored on a computer-readable storage medium and/or a hardware module and/or hardware apparatus. A computer-readable storage medium includes, but is not limited to, volatile memory, non-volatile memory, and magnetic and optical storage devices, such as disk drives, magnetic tape, CDs, DVDs, or other media, now known or later developed, that are capable of storing code and/or data. Hardware modules or apparatuses described herein include, but are not limited to, ASICs, FPGAs, dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

The embodiments disclosed herein are not to be limited in scope by the specific embodiments described herein. Various modifications of the embodiments of the present disclosure, in addition to those described herein, will be apparent to those of ordinary skill in the art from the foregoing description and accompanying drawings. Further, although some of the embodiments of the present disclosure have been described in the context of a particular implementation in a particular environment for a particular purpose, those of ordinary skill in the art will recognize that the disclosure's usefulness is not limited thereto and that the embodiments of the present disclosure can be beneficially implemented in any number of environments for any number of purposes.

What is claimed is:

1. A method comprising:
performing assist reads (AR) of multibit memory cells of a memory to determine an AR zone for each bit of data stored in the multibit memory cells;
performing soft reads of the multibit memory cells to determine a bin within the AR zone for each bit of the data stored in the multibit memory cells, wherein each bin is associated with a log likelihood ratio (LLR) value;
performing error correction decoding on the data stored in the multibit memory cells;
collecting statistics on the decoded data for each bin in each AR zone;
computing a hard error percentage for each AR zone based on the collected 10 statistics; and
adjusting one or more LLR values based on the hard error percentage.

2. The method of claim 1, wherein collecting the statistics includes maintaining a counter for each bin in each AR zone that decoded to a bit value of 0, and maintaining a counter for each bin in each AR zone that decoded to a bit value of 1.

3. The method of claim 1, wherein the hard error percentage is a hard error percentage of reading a bit value of 0 that decoded to a bit value of 1.

4. The method of claim 3, wherein adjusting the one or more LLR values includes:
comparing the hard error percentage with a threshold;
determining that the hard error percentage is above the threshold; and
decreasing the LLR value associated with the bin having a largest likelihood of being a bit value of 0.

5. The method of claim 1, wherein the hard error percentage is a hard error percentage of reading a bit value of 1 that is decoded to a bit value of 0.

6. The method of claim 5, wherein adjusting the one or more LLR values includes:
comparing the hard error percentage with a threshold;
determining that the hard error percentage is above the threshold; and
increasing the LLR value associated with the bin having a largest likelihood of being a bit value of 1.

7. The method of claim 1, wherein the statistics collected for pages of a page group are combined together to adjust the one or more LLR values, and the adjusted one or more LLR values is applied to all pages within the page group.

8. The method of claim 1, wherein each AR zone has at least eight bins.

9. A device comprising:
a memory; and
one or more processors configured to access the memory and perform operations including:
performing soft reads of multibit memory cells of a flash memory to determine a bin for each bit of data stored in the multibit memory cells, wherein each bin is associated with a log likelihood ratio (LLR) value;

performing error correction decoding on the data stored in the multibit 8 memory cells;

collecting statistics on the decoded data;

computing a hard error percentage based on the collected statistics; and adjusting one or more LLR values based on the hard error percentage.

10. The device of claim 9, wherein collecting statistics on the decoded data includes maintaining counters for a plurality of bins that decoded to a bit value of 0.

11. The device of claim 9, wherein collecting statistics on the decoded data includes maintaining counters for bins that decoded to a bit value of 1.

12. The device of claim 9, wherein the hard error percentage is a hard error percentage of reading a bit value of 0 that decoded to a bit value of 1.

13. The device of claim 12, wherein adjusting the one or more LLR values includes:

comparing the hard error percentage with a threshold;

determining that the hard error percentage is above the threshold; and decreasing the LLR value associated with the bin having a largest likelihood of being a bit value of 0.

14. The device of claim 9, wherein the hard error percentage is a hard error percentage of reading a bit value of 1 that is decoded to a bit value of 0.

15. The device of claim 14, wherein adjusting the one or more LLR values includes:

comparing the hard error percentage with a threshold;

determining that the hard error percentage is above the threshold; and increasing the LLR value associated with the bin having a largest likelihood of being a bit value of 1.

16. The device of claim 9, wherein the statistics collected for pages of a page group are combined together to adjust the one or more LLR values, and the adjusted one or more LLR values are applied to all pages within the page group.

17. The device of claim 16, wherein the operations further include storing a plurality of LLR tables, wherein each of the LLR tables contains a set of LLR values for a corresponding page group of a plurality of page groups in the memory.

18. A non-transitory computer readable medium storing code that, when executed by one or more processors, causes the one or more processors to perform operations including:

performing soft reads of multibit memory cells of a memory to determine a bin for each bit of data stored in the multibit memory cells, wherein each bin is associated with a log likelihood ratio (LLR) value;

performing error correction decoding on the data stored in the multibit memory cells;

collecting statistics on the decoded data;

computing a hard error percentage based on the collected statistics; and adjusting one or more LLR values based on the hard error percentage.

19. The non-transitory computer readable medium of claim 18, wherein collecting the statistics includes maintaining a counter for each bin that decoded to a bit value of 0, and maintaining a counter for each bin that decoded to a bit value of 1.

20. The non-transitory computer readable medium of claim 18, wherein the operations further include storing a plurality of LLR tables, wherein each of the LLR tables contains a set of LLR values for a corresponding page group of a plurality of page groups in the memory.

* * * * *